(12) United States Patent
Wang et al.

(10) Patent No.: US 8,368,118 B2
(45) Date of Patent: Feb. 5, 2013

(54) SEMICONDUCTOR STRUCTURE HAVING AN ELOG ON A THERMALLY AND ELECTRICALLY CONDUCTIVE MASK

(75) Inventors: Shih-Yuan Wang, Palo Alto, CA (US); Lars Helge Thylen, Huddinge (SE); Sagi Varghese Mathai, Berkeley, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 41 days.

(21) Appl. No.: 13/133,370

(22) PCT Filed: Dec. 16, 2008

(86) PCT No.: PCT/US2008/086991
§ 371 (c)(1),
(2), (4) Date: Jun. 7, 2011

(87) PCT Pub. No.: WO2010/071633
PCT Pub. Date: Jun. 24, 2010

(65) Prior Publication Data
US 2011/0241072 A1    Oct. 6, 2011

(51) Int. Cl.
*H01L 21/02* (2006.01)
*H01L 21/20* (2006.01)
(52) U.S. Cl. ...................... 257/190; 438/496

(58) Field of Classification Search .............. None
See application file for complete search history.

(56) References Cited

U.S. PATENT DOCUMENTS

| | | | |
|---|---|---|---|
| 4,948,456 A * | 8/1990 | Schubert | 117/90 |
| 5,217,564 A | 6/1993 | Bozler et al. | |
| 6,355,497 B1 | 3/2002 | Romano et al. | |
| 6,447,938 B1 * | 9/2002 | Bianchi | 428/698 |
| 6,455,340 B1 | 9/2002 | Chua et al. | |
| 6,958,254 B2 * | 10/2005 | Seifert | 438/47 |
| 7,033,858 B2 | 4/2006 | Chai et al. | |
| 2003/0236000 A1 * | 12/2003 | Vogeli et al. | 438/778 |
| 2004/0082150 A1 | 4/2004 | Kong et al. | |
| 2005/0186757 A1 | 8/2005 | Wu et al. | |
| 2006/0284163 A1 | 12/2006 | Bour et al. | |
| 2007/0057270 A1 | 3/2007 | Bour et al. | |
| 2008/0171424 A1 * | 7/2008 | Li et al. | 438/496 |
| 2009/0321715 A1 * | 12/2009 | Kobayashi et al. | 257/14 |
| 2011/0310920 A1 * | 12/2011 | Lee et al. | 372/45.01 |

FOREIGN PATENT DOCUMENTS

| | | | |
|---|---|---|---|
| JP | 14-134735 | | 5/2002 |
| JP | 2002134735 | * | 5/2002 |

* cited by examiner

*Primary Examiner* — Shouxiang Hu
*Assistant Examiner* — Harpreet Singh

(57) ABSTRACT

A semiconductor structure includes a substrate, a thermally and electrically conductive mask positioned upon the substrate, and an epitaxial lateral over growth (ELOG) material positioned upon the thermally and electrically conductive mask.

13 Claims, 3 Drawing Sheets

US 8,368,118 B2

SEMICONDUCTOR STRUCTURE HAVING AN ELOG ON A THERMALLY AND ELECTRICALLY CONDUCTIVE MASK

BACKGROUND

Heteroepitaxy is often used to create layered structures of different types of materials on substrates that are not lattice matched and otherwise would not form high quality epitaxial layers on the substrates. For instance, gallium nitride (GaN) does not form well on substrates made of sapphire ($Al_2O_3$) or silicon on sapphire (SOS) because of a relatively high level of lattice mismatch between the GaN and the sapphire or silicon on sapphire. The lattice mismatch often results in defects and dislocations in the GaN. To overcome these problems, epitaxial lateral overgrowth (ELOG) is used to form the GaN material, or other material, on another material, typically, through a channel or aperture in a dielectric material on a crystalline substrate.

An example of a conventional structure 100 formed through heteroepitaxy of an epitaxial lateral overgrowth (ELOG) material 110, such as, GaN, indium phosphide (InP), gallium arsenide (GaAs), etc., and a substrate 120 is shown in FIG. 1. As shown therein, a cross-sectional view of the structure 100 illustrates that a mask 130 is created on the substrate 120 using the dielectric material. The ELOG material 110 is shown without hash marks to more clearly show its position with respect to the mask 130.

The structure 100 is also depicted as including a channel 132, which is typically a few microns wide, in the dielectric mask 130. The ELOG material 110 is grown out of the channel 132 from seed material layer 120. More particularly, the ELOG material 110 grows from the channel 132 and spreads out of the channel 132 and across parts of the dielectric mask 130, as shown in FIG. 1. The dielectric material is used to form the mask 130 because it is able to withstand the relatively high temperatures that are required to grow the ELOG material 110 and also enables a suitable surface on which the ELOG material 110 laterally grows. As a comparison, conventional metals typically cannot be used as the mask 130 because the metals are prone to melting or forming alloys with the ELOG material at the temperatures required for the ELOG material to properly grow.

One problem with the ELOG material 110 formation is that as the ELOG material 110 grows out of the channel 132, defects 112 are often created in the transition from the vertical extension to the lateral overgrowth. However, material quality tends to increase as the layer spreads out over the dielectric mask 130. To avoid the defects 112, devices 140 are typically built upon wing portions 114 of the ELOG material 110, or the wing portions 114 form parts of the devices 140, which are generally laterally spaced from the defects 112. This configuration results in some undesirable characteristics in the structure 100.

For instance, the insulating properties of the dielectric mask 130 cause current crowding and thermal crowding because electrical current must flow along the wings 114 of the ELOG material 110 and then through the material 110 contained in the channel 132, as indicated by the arrows 142. In addition, heat generated in the devices 140 must also flow through this path to become dissipated through the substrate 120. This is not an ideal path for either the current or heat to flow because it constricts the heat and current flow and often results in overheating, which may impair the functioning of devices 140. In addition, the current crowding causes non-uniform current and the behavior of the devices 140 consequently suffers. The current and thermal crowding ultimately limits the flexibility of the devices that may be built using a dielectric mask and often requires additional heat dissipation solutions, which adds to the costs associated with implementing the structure 100, as well as the size of the structure 100.

BRIEF DESCRIPTION OF THE DRAWINGS

Embodiments are illustrated by way of example and not limited in the following figure(s), in which like numerals indicate like elements, in which.

DETAILED DESCRIPTION

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In other instances, well known methods and structures are not described in detail so as not to unnecessarily obscure the description of the embodiments.

Disclosed herein are semiconductor structures that contain ELOG materials formed on thermally and electrically conductive masks. The thermally and electrically conductive masks may be formed of carbon nanostructures or graphene. The thermal and electrical conductive properties of the masks upon which the ELOG materials are formed generally enable heat and current to be conducted more readily between devices positioned on the ELOG materials and a substrate upon which the thermally and electrical conductive masks are positioned as compared with conventional ELOG structures that employ dielectric masks.

Figure 2:
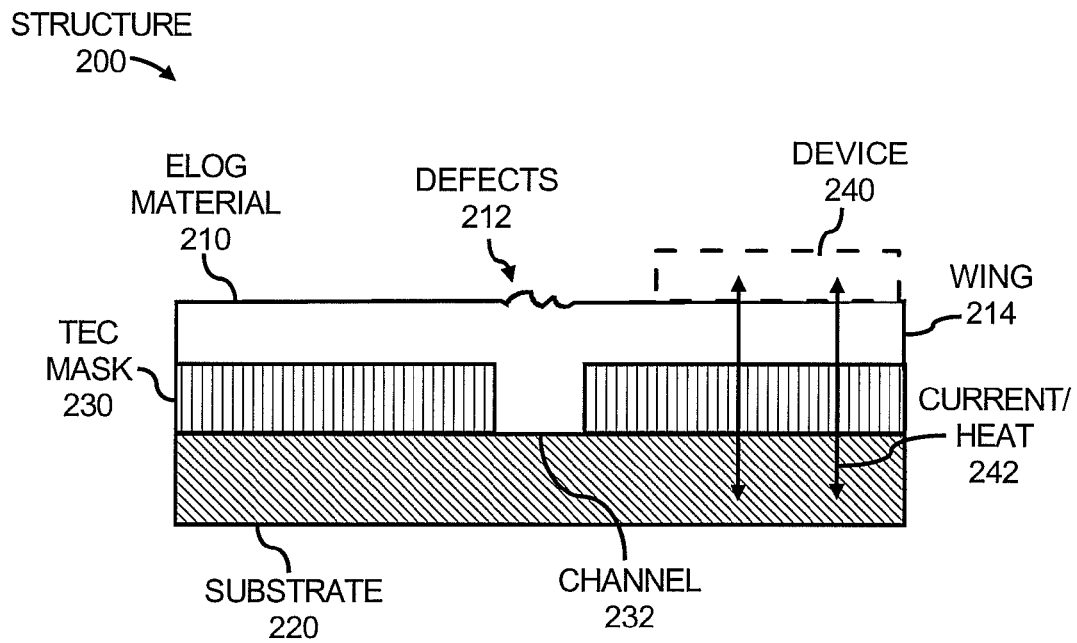
FIG. 2 illustrates a cross-sectional side view of a portion of a semiconductor structure, according to an embodiment of the invention.

With reference first to FIG. 2, there is shown a cross-sectional side view of a portion of a semiconductor structure 200, in accordance with an embodiment. It should be understood that the portion of the semiconductor structure 200 may include additional components and that some of the components described herein may be removed and/or modified without departing from a scope of the semiconductor structure 200.

Figure 1:
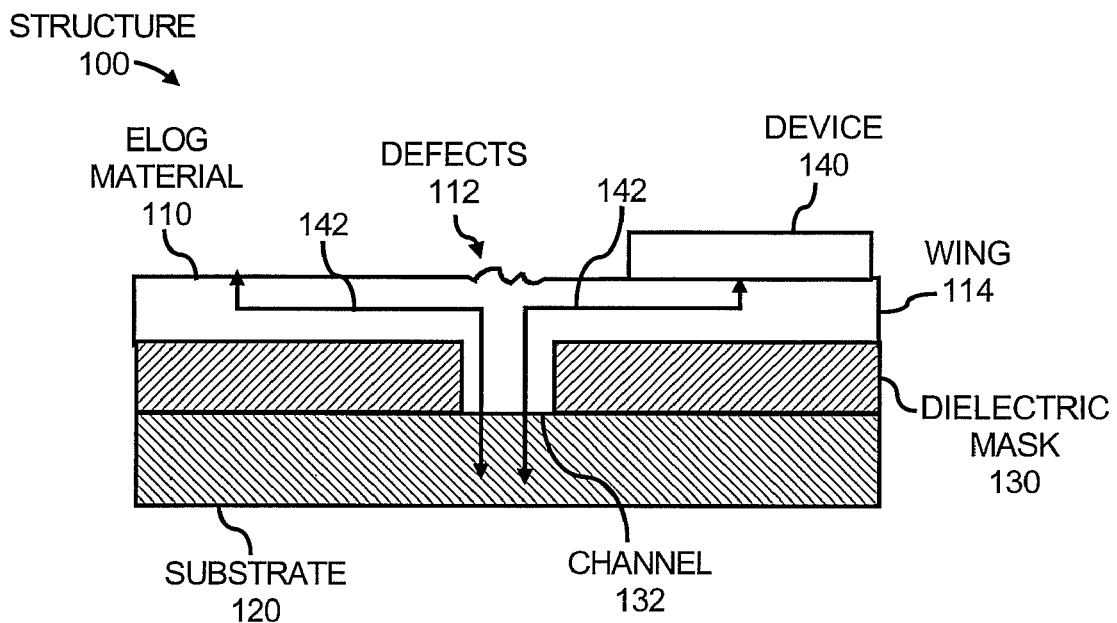
FIG. 1 illustrates a cross-sectional side view of a portion of a conventional semiconductor structure.

As shown in FIG. 2, the semiconductor structure 200 includes an epitaxial lateral overgrowth (ELOG) material 210, a substrate 220, and a thermally and electrically conductive (TEC) mask 230. The ELOG material 210 is generally composed of a growth material, such as, GaN, GaInN, GaAlN, AlN, InN, InP, InGaAsP, InGaAs, GaAs, AlGaAs, Si, SiGe, and all possible III-V family and its alloys, etc., which grows lattice mismatched in the channel 232 on the substrate 220 initially vertically and then grows laterally and vertically over the TEC mask 230. The ELOG material 210 has therefore been formed from vertical growth out of the channel 232 and through lateral spreading over parts of the TEC mask 230, in manners similar to those discussed above with respect to ELOG growth over the dielectric mask 130 (FIG. 1).

The substrate 220 is composed of any suitable crystalline material such as SiC, Sapphire, Si, Ge, and the like. The TEC mask 230 overlies the substrate 220 and provides adequate surfaces for the ELOG material 210 to form through an ELOG process from the channel 232 formed in the TEC mask

230. As the name implies, the TEC mask 230 is formed of one or more materials that are capable of electrical and thermal conductance levels that exceed the dielectric materials used in conventional ELOG structures. Examples of suitable electrical and thermal conductance levels are, for instance, electrical and thermal conductance levels that are similar to or exceed the levels of metals, such as copper and the like. According to an embodiment, the TEC mask 230 is composed of graphene or carbon nanostructures, such as, nanotubes or other shaped nano-scale structures, which are capable of conducting current and heat at much higher levels as compared with the dielectric material 130 (FIG. 1) employed in conventional structures.

According to a further embodiment, the TEC mask 230 is composed of relatively high density carbon nanostructures to substantially prevent the ELOG material 210 from forming additional defects caused by vertical growth from the substrate 220. In this embodiment, therefore, the carbon nanostructures forming the TEC mask 230 have a sufficiently high density to substantially prevent wings 214 of the ELOG material 210 from having a relatively large number of defects during the ELOG process. By way of example, carbon nanostructures are considered to be insufficiently dense if the wings 214 are formed with a number of defects due to wings 214 growing vertically from the substrate 220 in a manner that substantially prevents a device 240 from properly attaching to the wings 214. The device 240 may be considered as being unable to properly attach to the wings 214, for instance, if there is an insufficient amount of space between defects to enable the device 240 to be situated on the wings 214 without contacting the defects.

Through use of the carbon nanostructures or the graphene in the TEC mask 230, electrical and thermal conduction between a device 240 and the substrate 220 may occur more readily as compared with conventional structures. The increase in electrical and thermal conduction as compared with conventional structures occurs because current and heat are conducted through a much larger area (over the TEC mask 230) than the material contained in the channel 132 of a conventional structure 100. In addition, the carbon nanostructures and the graphene materials are suitable for the ELOG process because they are able to withstand the relatively high temperatures that often required for the ELOG process to occur.

In FIG. 2, the device 240 has been shown with dashed lines to indicate that the device 240 does not necessarily form part of the semiconductor structure 200. Instead, the structure 200 and the device 240 may form part of an apparatus, such as, a laser, a transistor, a photodetector, an optical amplifier, an optical waveguide, an optical modulator, etc., in which case, the structure 200 and the device 240 are components of the apparatus.

It should be understood that the portion of the semiconductor structure 200 depicted in FIG. 2 may form part of a larger semiconductor structure or may include additional elements to form a larger semiconductor structure. For instance, the semiconductor structure 200 may include additional channels 232 from which the ELOG material 210 grows. In this regard, the semiconductor structure 200 may be considered as a relatively larger structure having a number of wings 214 upon which devices 240 may be positioned. Additional embodiments pertaining to the semiconductor structure 200 are described with respect to the following figures.

Figure 3A:
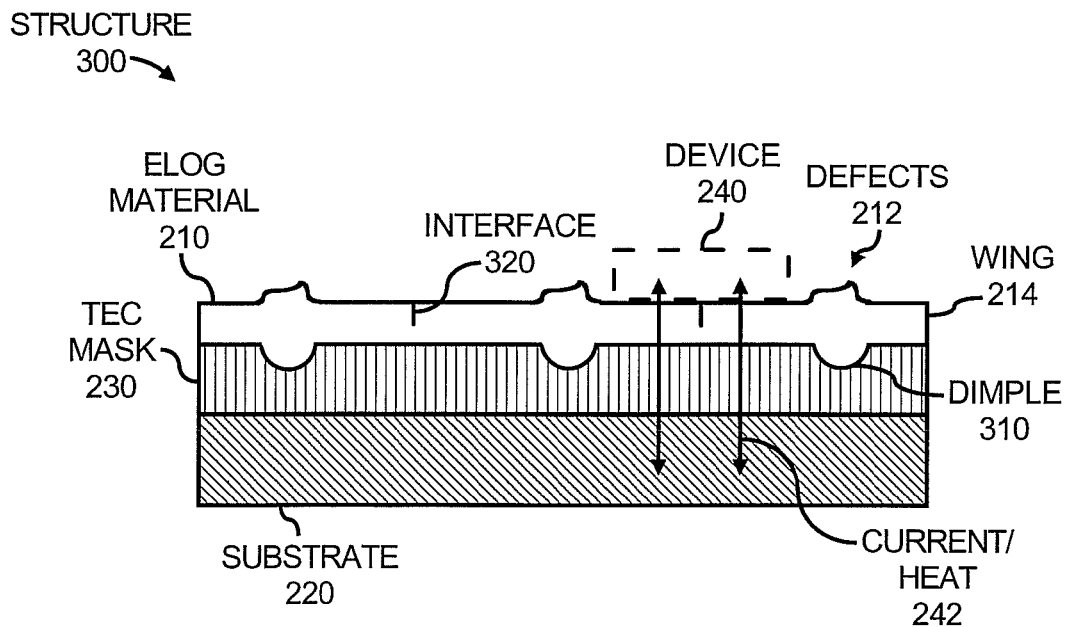
FIGS. 3A and 3B, respectively, illustrate cross-sectional side views of portions of semiconductor structures, according to embodiments of the invention.
Figure 3B:
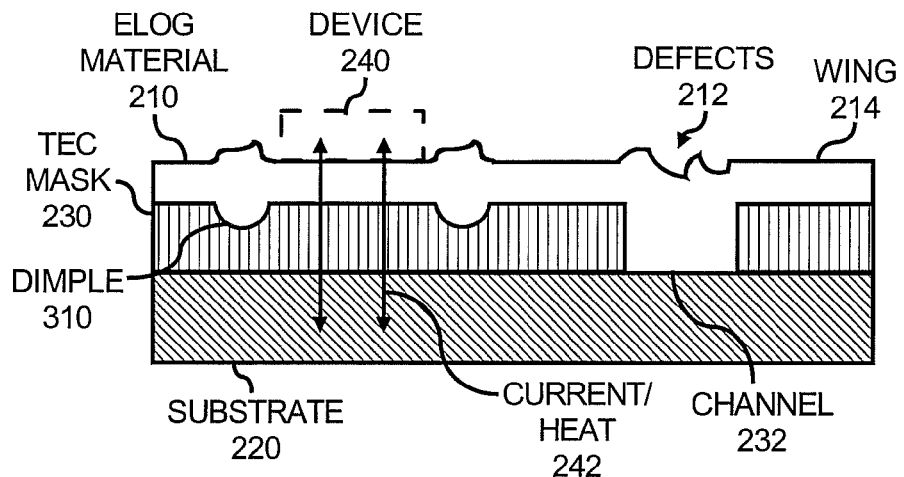

Turning first to FIGS. 3A and 3B, there are shown cross-sectional side views of portions of semiconductor structures 300 and 350, in accordance with other embodiments. It should be understood that the portions of the semiconductor structures 300 and 350 may include additional components and that some of the components described herein may be removed and/or modified without departing from scopes of the semiconductor structures 300 and 350.

The semiconductor structures 300 and 350 depicted in FIGS. 3A and 3B include many of the same elements as the semiconductor structure 200 depicted in FIG. 2. As such, only those elements that differ from the semiconductor structure 200 will be described with respect to the semiconductor structures 300 and 350.

As shown in FIG. 3A, the TEC mask 230 includes a plurality of dimples 310. The dimples 310 are formed on the surface opposite the substrate 220 and do not extend through the TEC mask 230. In addition, the dimples 310 may be formed on the TEC mask 230 surface through any reasonably suitable fabrication technique. Although the dimples 310 have been depicted as having semi-circular cross-sectional shapes, the dimples 310 may have any other suitable shapes, such as, vertically extending side walls, horizontally extending bottom wall, one vertically extending side wall and wall curved side wall, etc. In one regard, use of the TEC mask 230 generally enables the ELOG material 210 to be formed on the TEC mask 230 without requiring that the ELOG material 210 extend and directly contact the substrate 220.

According to an embodiment, seed material, such as nanocrystalline or micro-crystalline silicon or III-V materials that can initiate epitaxial growth for the ELOG material 210, may be placed in one or more of the dimples 310 and may be grown laterally out of the dimples 310. In this embodiment, the ELOG material 210 grown from one dimple 310 may meet the ELOG material 210 grown from another dimple 310 at an interface 320. Although the interfaces 320 have been depicted as comprising vertically extending sections of ELOG materials 210, the ELOG materials 210 grown from separate dimples 310 may become interfaced with one another in various other patterns. In another embodiment, the dimples 310 may be spaced sufficiently apart from each other to enable the ELOG material 210 to grow from the dimples 310 without contacting each other. In any regard, when the ELOG material 210 growth is initiated from the dimples 310, the substrate 220 need not be crystalline and may be non-single crystalline or even amorphous.

As further shown, defects 212 may occur during the transition of the vertical extension to the lateral extension of the ELOG material 210. As discussed above, it is beneficial to be able to place devices 240 on the wings 214 of the ELOG material 210 as opposed to the locations where defects 212 exist. In one regard, therefore, the dimples 310 may be spaced sufficiently apart from each other to enable sufficient space on the wings 214 for placement of at least portions of the devices 240.

Through implementation of the structure 300 depicted in FIG. 3A, the ELOG material 210 may be formed to be relatively thinner and to be formed in a relatively less amount of time as compared with ELOG material 210 growth from the channel 232. For instance, the dimples 310 may be formed to have a relatively smaller size, such as, around tens of nanometers or less, than the channel 232 (FIG. 2), which may be about a micron wide.

Turning now to FIG. 3B, the semiconductor structure 350 includes all of the elements of the semiconductor structure 300. In addition, however, the semiconductor structure 350 includes a channel 232 from which the ELOG material 210 grows. In this regard, the ELOG material 210 may grow into the dimples 310 as it is laterally extended across the wings 214 of the ELOG material 210.

Figure 4:
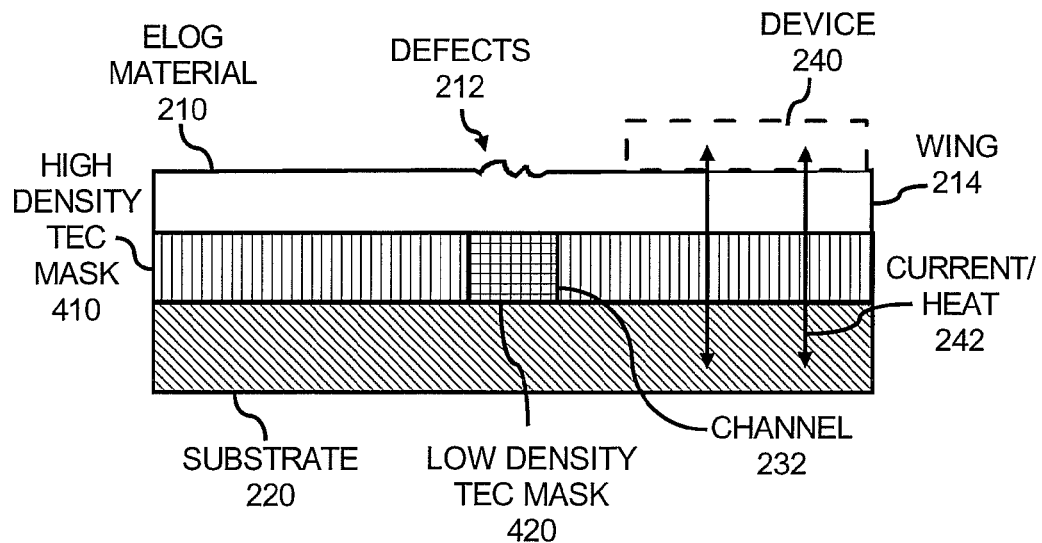
FIG. 4 depicts a cross-sectional side view of a portion of a semiconductor structure, according to an embodiment of the invention.

With reference now to FIG. 4, there is shown a cross-sectional side view of a portion of a semiconductor structure 400, in accordance with another embodiment. It should be understood that the portion of the semiconductor structure 400 may include additional components and that some of the components described herein may be removed and/or modified without departing from a scope of the semiconductor structure 400.

The semiconductor structure 400 depicted in FIG. 4 includes many of the same elements as the semiconductor structure 200 depicted in FIG. 2. As such, only those elements that differ from the semiconductor structure 200 will be described with respect to the semiconductor structure 400.

As shown in FIG. 4, the TEC mask 410 is composed of a high density material. In this regard, the TEC mask 410 is composed of relatively high density carbon nanostructures or graphene. In addition, a low density TEC mask 420 is positioned in the channel 232. In this regard, the low density TEC mask 420 is composed of relatively low density carbon nanostructures or graphene. According to an embodiment, the high density TEC mask 410 is composed of sufficiently high density material to substantially prevent deformations or other defects in the ELOG material 210 as it is grown. Likewise, the low density TEC mask 420 is composed of sufficiently low density material to enable seed material for the ELOG material 210 to be placed in spaces between the material and for the ELOG material 210 to grow out of the spaces between the material. By way of example, the low density TEC mask 420 is formed to include spaces between vertically extending portions of the TEC mask 420 material, to thus enable the ELOG material 210 to grow vertically from the spaces. In addition, as the ELOG material 210 grows from individual spaces in the low density TEC mask 420 and extends above the low-density TEC mask 420, the ELOG material 210 may become combined with the ELOG material 210 extending from other spaces as it is grown laterally across the high density TEC mask 410.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the scope of the invention, which is intended to be defined by the following claims—and their equivalents—in which all terms are meant in their broadest reasonable sense unless otherwise indicated.

What is claimed is:

1. A semiconductor structure comprising:
a substrate;
a thermally and electrically conductive mask positioned upon said substrate; and
an epitaxial lateral over growth (ELOG) material positioned upon said thermally and electrically conductive mask, wherein said thermally and electrically conductive mask comprises a material selected from the group consisting of carbon nanostructures and graphene.

2. The structure of claim 1, wherein said thermally and electrically conductive mask comprises a plurality of dimples.

3. The structure of claim 1, wherein said thermally and electrically conductive mask contains at least one trench, wherein the ELOG material contains a vertically extending section that extends from the at least one trench.

4. The structure of claim 3, wherein said thermally and electrically conductive mask comprises a high density thermally and electrically conductive mask and a low density thermally and electrically conductive mask, wherein the at least one trench is formed in the high density thermally and electrically conductive mask and said low density thermally and electrically conductive mask if positioned in the at least one trench and containing a plurality of spaces, said vertically extending section of the ELOG material extending from the plurality of spaces.

5. An apparatus comprising:
a substrate;
a thermally and electrically conductive mask positioned upon said substrate;
an epitaxial lateral over growth (ELOG) material positioned upon said thermally and electrically conductive mask; and
a device positioned upon the ELOG material,
wherein said thermally and electrically conductive mask comprises a material selected from the group consisting of densely packed carbon nanostructures and graphene.

6. The apparatus of claim 5, wherein said thermally and electrically conductive mask comprises a plurality of dimples.

7. The apparatus of claim 6, wherein the ELOG material has a surface and wherein the dimples are sufficiently spaced in at least one area to position at least a portion of the device upon said surface of the ELOG material.

8. The apparatus of claim 5, wherein said thermally and electrically conductive mask contains at least one trench, wherein the ELOG material contains a vertically extending section that extends from the at least one trench.

9. The apparatus of claim 8, wherein said thermally and electrically conductive mask comprises a high density thermally and electrically conductive mask and a low density thermally and electrically conductive mask, wherein the at least one trench is formed in the high density thermally and electrically conductive mask and said low density thermally and electrically conductive mask if positioned in the at least one trench and containing a plurality of spaces, said vertically extending section of the ELOG material extending from the plurality of spaces.

10. The apparatus of claim 5, wherein said device comprises a component of at least one of a semiconductor laser, transistor, photodetector, optical amplifier, optical waveguide, and optical modulator.

11. A semiconductor structure comprising:
a substrate;
a thermally and electrically conductive mask positioned on the substrate, wherein said thermally and electrically conductive mask comprises a material selected from the group consisting of densely packed carbon nanostructures and graphene, wherein said thermally and electrically conductive mask contains at least one trench; and
an epitaxial lateral over growth (ELOG) material positioned upon said thermally and electrically conductive mask, and wherein the ELOG material contains a vertically extending section that extends from the at least one trench.

12. The structure of claim 11, further comprising:
low density thermally and electrically conductive material positioned in the at least one trench, said low density thermally and electrically conductive material comprising spaces, and wherein the ELOG material extends from the spaces.

13. The structure of claim 11, further comprising a device positioned on a portion of the ELOG material, wherein the device is a component of an electronic device.

* * * * *